(12) United States Patent
Kaneko et al.

(10) Patent No.: US 12,051,480 B2
(45) Date of Patent: Jul. 30, 2024

(54) SEMICONDUCTOR STORAGE DEVICE

(71) Applicant: Winbond Electronics Corp., Taichung (TW)

(72) Inventors: Fujimi Kaneko, Kanagawa (JP); Makoto Senoo, Kanagawa (JP); Takamichi Kasai, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 137 days.

(21) Appl. No.: 17/878,847

(22) Filed: Aug. 1, 2022

(65) Prior Publication Data

US 2023/0066907 A1 Mar. 2, 2023

(30) Foreign Application Priority Data

Aug. 27, 2021 (JP) .................................. 2021-138744

(51) Int. Cl.
*G11C 29/52* (2006.01)
*G11C 7/10* (2006.01)
*G11C 7/22* (2006.01)

(52) U.S. Cl.
CPC ............ *G11C 29/52* (2013.01); *G11C 7/1063* (2013.01); *G11C 7/222* (2013.01)

(58) Field of Classification Search
CPC ....... G11C 29/52; G11C 7/1063; G11C 7/222; G11C 2029/0411; G11C 29/42; G11C 29/00; G06F 11/1048; G06F 11/1044; G06F 11/1032; G06F 11/1068; G06F 11/10

See application file for complete search history.

(56) References Cited

U.S. PATENT DOCUMENTS

| 9,159,422 | B1 | 10/2015 | Lee et al. |
| 9,197,247 | B2 | 11/2015 | Kim et al. |
| 10,552,047 | B2 | 2/2020 | Nosaka et al. |
| 2011/0179212 | A1 | 7/2011 | Hartman |

(Continued)

FOREIGN PATENT DOCUMENTS

| CN | 203745976 | 7/2014 |
| JP | 2010033120 | 2/2010 |

(Continued)

OTHER PUBLICATIONS

"Office Action of Taiwan Counterpart Application", issued on Aug. 28, 2023, p. 1-p. 7.

(Continued)

*Primary Examiner* — Ajay Ojha

(74) *Attorney, Agent, or Firm* — JCIPRNET

(57) ABSTRACT

The disclosure provides a semiconductor storage device, which can shorten the processing time for error detection and correction. The flash memory of the present disclosure has a NAND chip and an ECC chip. The NAND chip has dedicated input and output terminals which can transmit data with the ECC chip, and the ECC chip has a dedicated input and output terminal which can transmit data with the NAND chip. When reading in the NAND chip, the NAND chip transmits the read data containing the parity data to the ECC chip through the dedicated input and output terminals. The ECC chip detect and correct errors in the read data based on the parity data, and the corrected data is transmitted to the controller through the input and output terminals.

14 Claims, 11 Drawing Sheets

(56) References Cited

U.S. PATENT DOCUMENTS

| | | |
|---|---|---|
| 2016/0283324 A1 | 9/2016 | Authement et al. |
| 2018/0129557 A1 | 5/2018 | Franca-Neto |
| 2022/0100395 A1* | 3/2022 | Kim ................... G11C 29/42 |
| 2022/0284935 A1* | 9/2022 | Sugahara .............. G11C 7/109 |

FOREIGN PATENT DOCUMENTS

| | | |
|---|---|---|
| TW | I501251 | 9/2015 |
| TW | I527191 | 3/2016 |
| TW | I546815 | 8/2016 |
| TW | I733923 | 7/2021 |

OTHER PUBLICATIONS

"Office Action of Japan Counterpart Application", issued on Oct. 5, 2022, with English translation thereof, p. 1-p. 7.

* cited by examiner

SEMICONDUCTOR STORAGE DEVICE

CROSS-REFERENCE TO RELATED APPLICATION

This application claims the priority benefit of Japan application serial no. 2021-138744, filed on Aug. 27, 2021. The entirety of the above-mentioned patent application is hereby incorporated by reference herein and made a part of this specification.

BACKGROUND

Field of the Disclosure

The present disclosure relates to a semiconductor storage device such as a Not AND (NAND)-type flash memory, and particularly to error detection and correction.

Description of Related Art

In a NAND-type flash memory, sometimes the repetition of programming or erasing of data results in deterioration of a tunnel insulating film, etc., which causes poor charge retention characteristics, or a threshold variation is occurred due to charges trapped in the tunnel insulating film, and bit error takes place as a result. As a countermeasure against such a bit error, an error checking and correcting circuit (hereinafter referred to as an ECC circuit) may be used in the flash memory.

SUMMARY

FIG. 1 is a diagram showing a configuration of a conventional off-chip ECC flash memory. The flash memory 10 is formed by including a NAND chip 20. The NAND chip 20 includes a NAND-type memory array or a peripheral circuit thereof, and the NAND chip 20 is connected to a controller chip 30 having an ECC function 40 mounted thereon. The NAND chip 20 and the controller chip 30 are respectively accommodated in different packages, and each package is packaged, for example, on a printed substrate.

For example, the NAND chip 20 and the controller chip 30 are equipped with a Serial Peripheral Interface (SPI) capable of transmitting data synchronously with a clock signal. The two chips are respectively provided with input and output (I/O) terminals of #CS, CLK, DI, DO, #WP, and #HOLD. The controller chip 30 sends commands, addresses, and data to the NAND chip 20 through the I/O terminals of the SPI.

The ECC function 40 includes: an encoder that encodes data and generates parity data; and a decoder that decodes the data based on the parity data. The ECC function 40 performs multi-bit (e.g., 2-bit, 4-bit, 8-bit, etc.) error detection and correction through, for example, BCH (Bose Chaudhuri Hocquenghem) code. Under the circumstances, the BCH decoder includes: a syndrome calculation portion which evaluates the syndrome of data; an Euclidean algorithm calculation portion which calculates the error location polynomial (ELP); an error location search portion which calculates the roots of the ELP and finds the error location; and an error correction portion which corrects errors based on the found error location.

The page buffer/sensing circuit of the NAND chip 20 includes two latches, one latch includes two caches, and one cache stores data of multiple sectors (e.g., 2 sectors, 4 sectors etc.). Data transmission between the NAND chip 20 and the controller chip 30 is performed in unit of cache. Furthermore, the ECC function 40 generates parity data on a sector-by-sector basis, or performs error detection and correction. A sector encoded by the ECC function 40 contains main data and parity data.

When the controller chip 30 performs the programming operation on the NAND chip 20, the ECC function 40 generates parity data according to the data to be programmed, and transmits the generated parity data and the main data to the NAND chip 20 through the DO terminal of the SPI. The NAND chip 20 holds the received main data and parity data in the latch, and programs the data held in the latch to a selected page of the memory array.

On the other hand, the data read from the memory array in the NAND chip 20 is transmitted to the controller chip 30 through the DO terminal of the SPI. The ECC function 40 detects errors based on the parity data, and corrects the main data or the parity data according to the detection results.

FIG. 2 is a timing chart showing the operation of each portion of the ECC function of the controller chip 30. The NAND chip 20 performs a read operation according to a read command transmitted from the controller chip 30, and outputs the read data to the controller chip 30. At time t0, the NAND_IF of the controller chip 30 starts to receive the main data and the parity data Pt of the sector S0 from the NAND chip 20, starts to receive the main data and the parity data Pt of the sector S1 at time t1, and starts to receive the main data and parity data Pt of the sector S2 and the sector S3 at time t2 and time t3. The ECC function 40 performs the calculation of the syndrome of the main data of the sector S0, the calculation of the ELP, and the search of the error location in the form of pipeline processing while the data of the sector S1 is being received, and corrects errors in the main data of the sector S0 based on the found error locations. Then, the CPU_IF of the controller chip 30 transmits the error-corrected data of the sector S0 to the host device. Regarding the ECC processing of the sector S1, the sector S2, and the sector S3, pipeline processing is performed in the same manner, and the error-corrected data of each sector is output during reception of the sector.

In the case of transmitting read data from the NAND chip 20 to the controller chip 30, the syndrome calculation must be performed after transmitting the parity data of the sector. Therefore, the following problem is inevitable, that is, if the bit width of the DO terminal of the SPI is narrow, data transmission takes time, the idle state of the controller chip 30 becomes longer during this period, and the performance of pipeline processing cannot be fully output.

The semiconductor storage device of the present disclosure includes: a NAND chip including a NAND-type memory array, and a control member that controls operations related to the memory array; and an ECC chip including error detection and correction functions. The NAND chip includes a first dedicated terminal for ECC-related data transmission, and the ECC chip includes a second dedicated terminal connected to the first dedicated terminal.

According to the present disclosure, the NAND chip and the ECC chip are respectively provided with the first dedicated terminal and the second dedicated terminal for data transmission related to ECC, thereby reducing the time for data transmission and reducing the idle state of ECC processing that takes place at the same time in the ECC chip. In this manner, the processing time for error detection and correction may be shortened.

Figure 6:
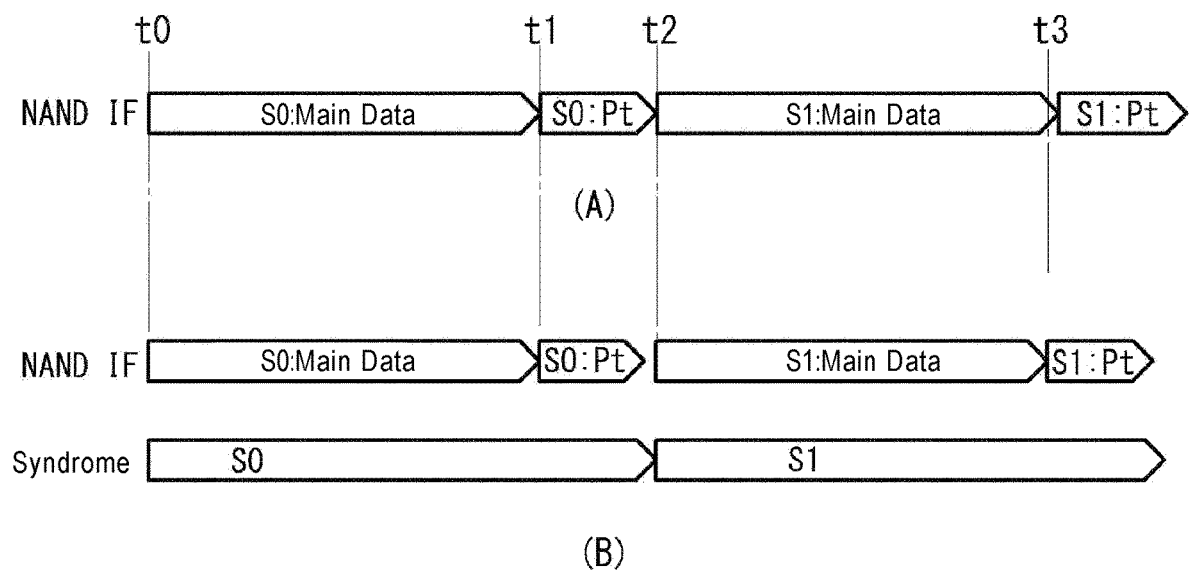

(A) of FIG. 6 and (B) of FIG. 6 are diagrams showing timings of data transmission of main data and parity data of sector S0; (A) of FIG. 6 shows a comparative example, and (B) of FIG. 6 represents the present embodiment.

Figure 7:
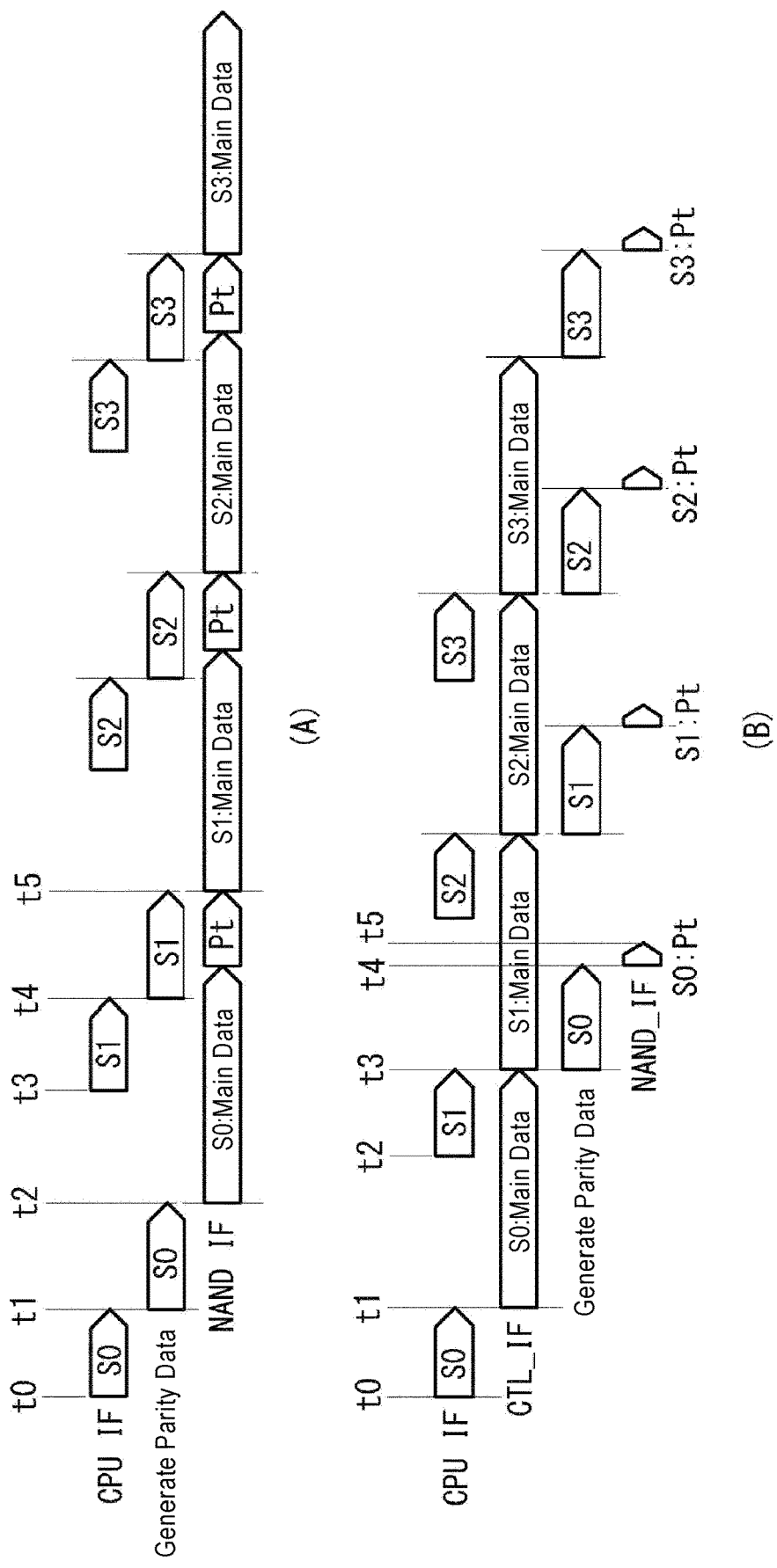

(A) of FIG. 7 and (B) of FIG. 7 are timing charts showing data registration and generating of parity data; (A) of FIG. 7 shows a conventional example, and (B) of FIG. 7 shows the present embodiment.

Figure 8:
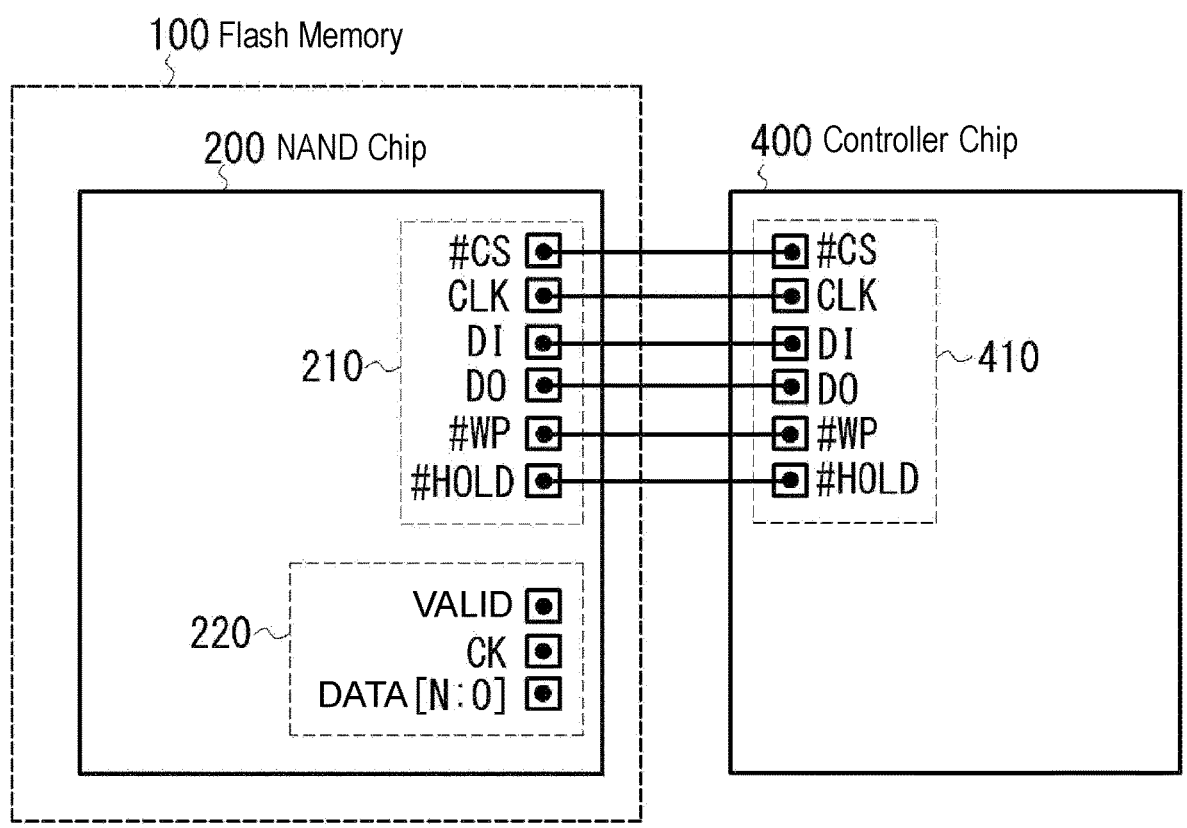

FIG. 8 is a diagram showing a structure of a flash memory on which the ECC chip in the embodiment of the present disclosure is not mounted.

Figure 9:
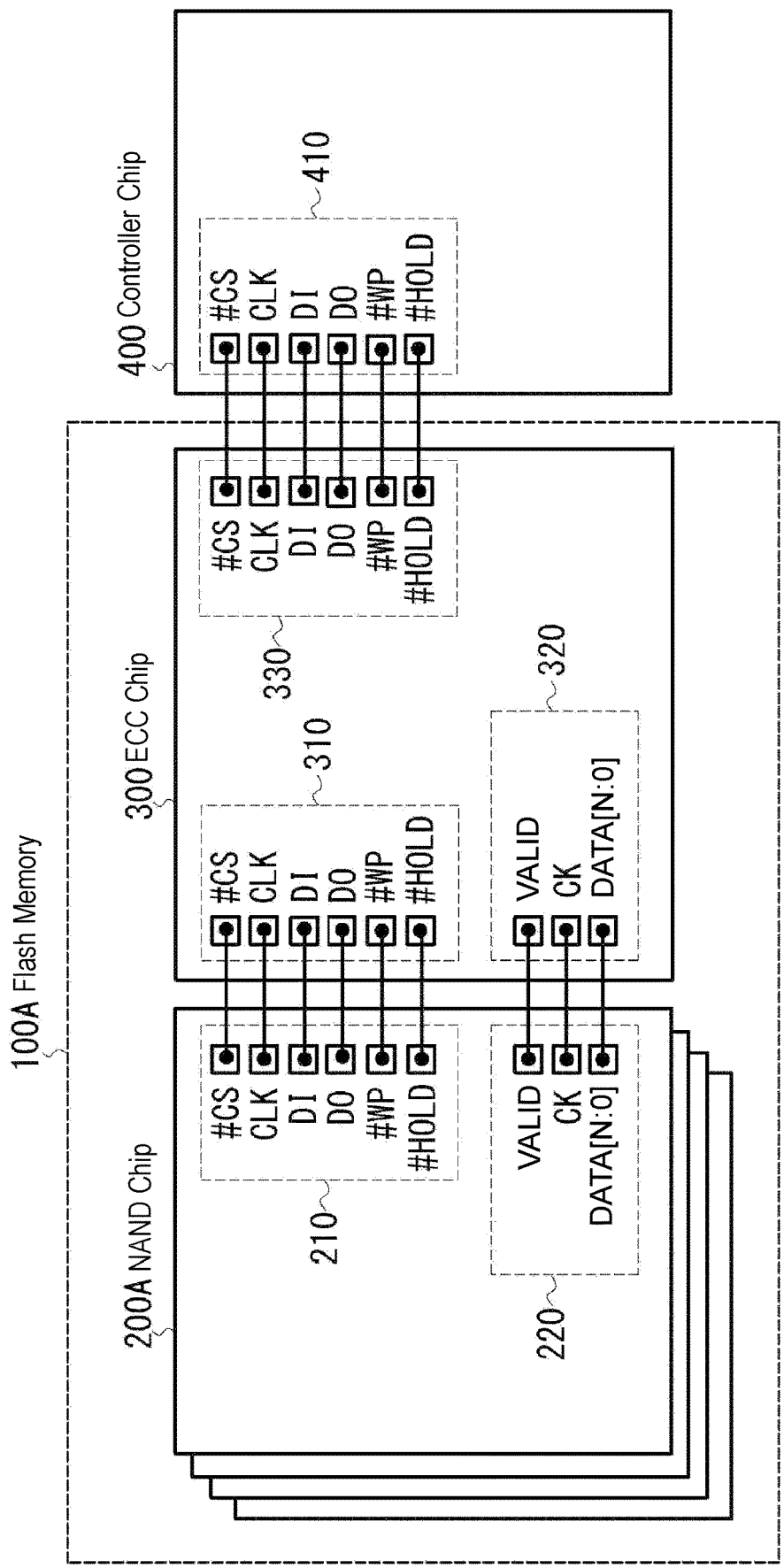

FIG. 9 is a diagram showing a structure of a flash memory in which a plurality of NAND chips in the embodiment of the present disclosure are stacked.

Figure 10:
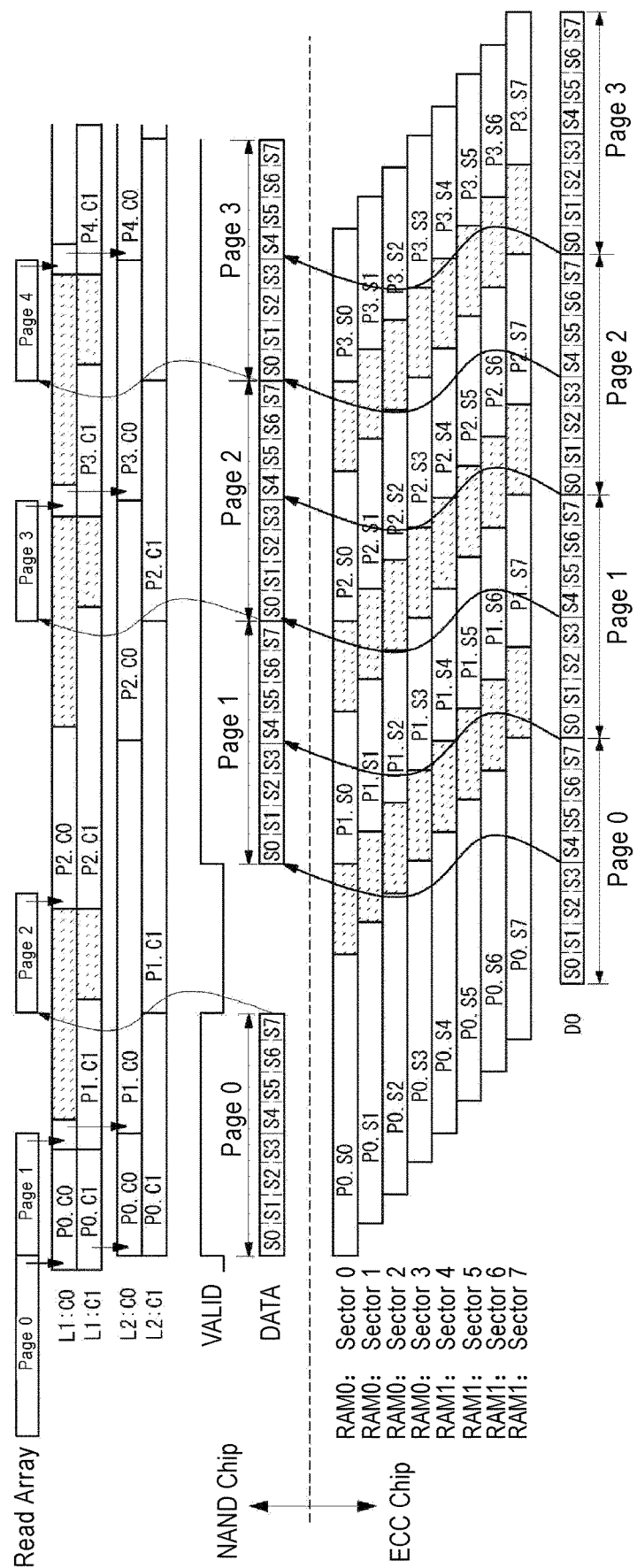

FIG. 10 is a diagram showing a timing chart of a continuous read operation of the flash memory according to the embodiment of the present disclosure.

Figure 10A:
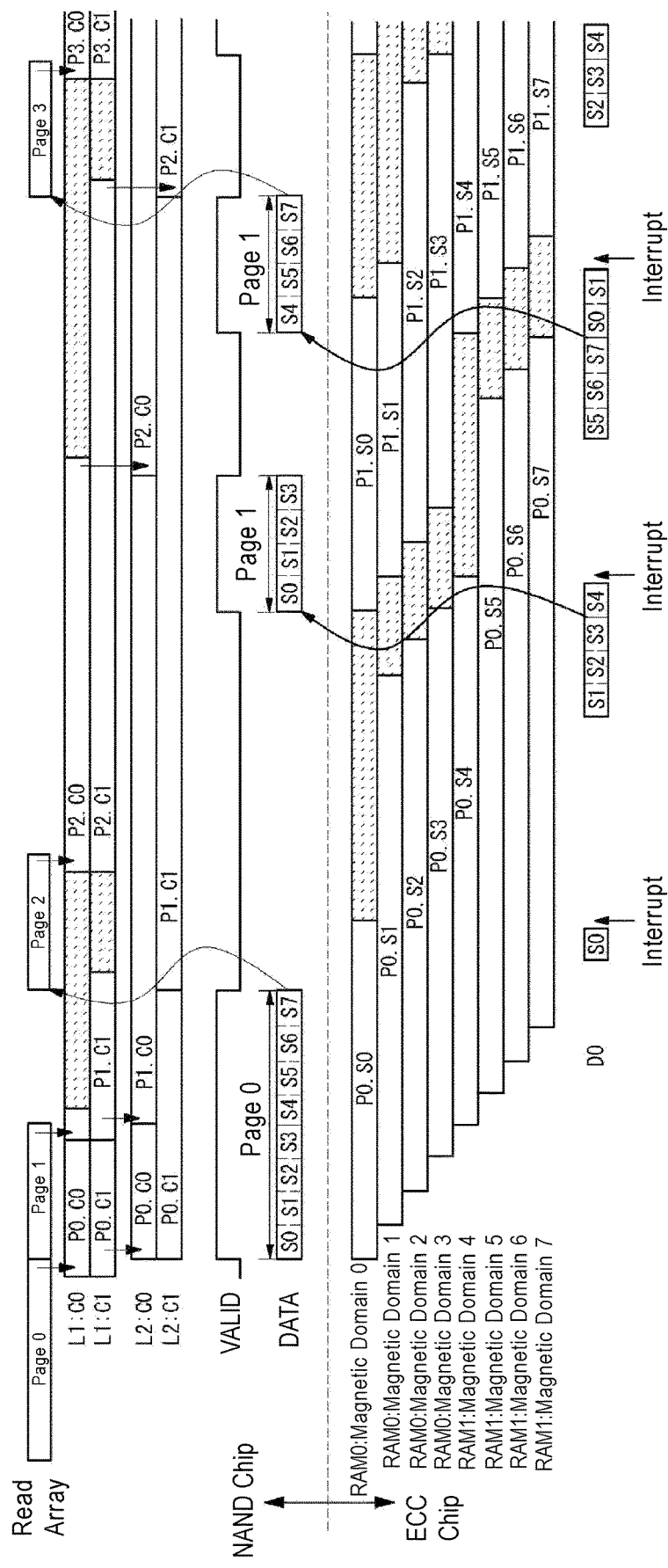

FIG. 10A is a diagram showing a timing chart when an interruption occurs in the continuous read operation.

Figure 11:
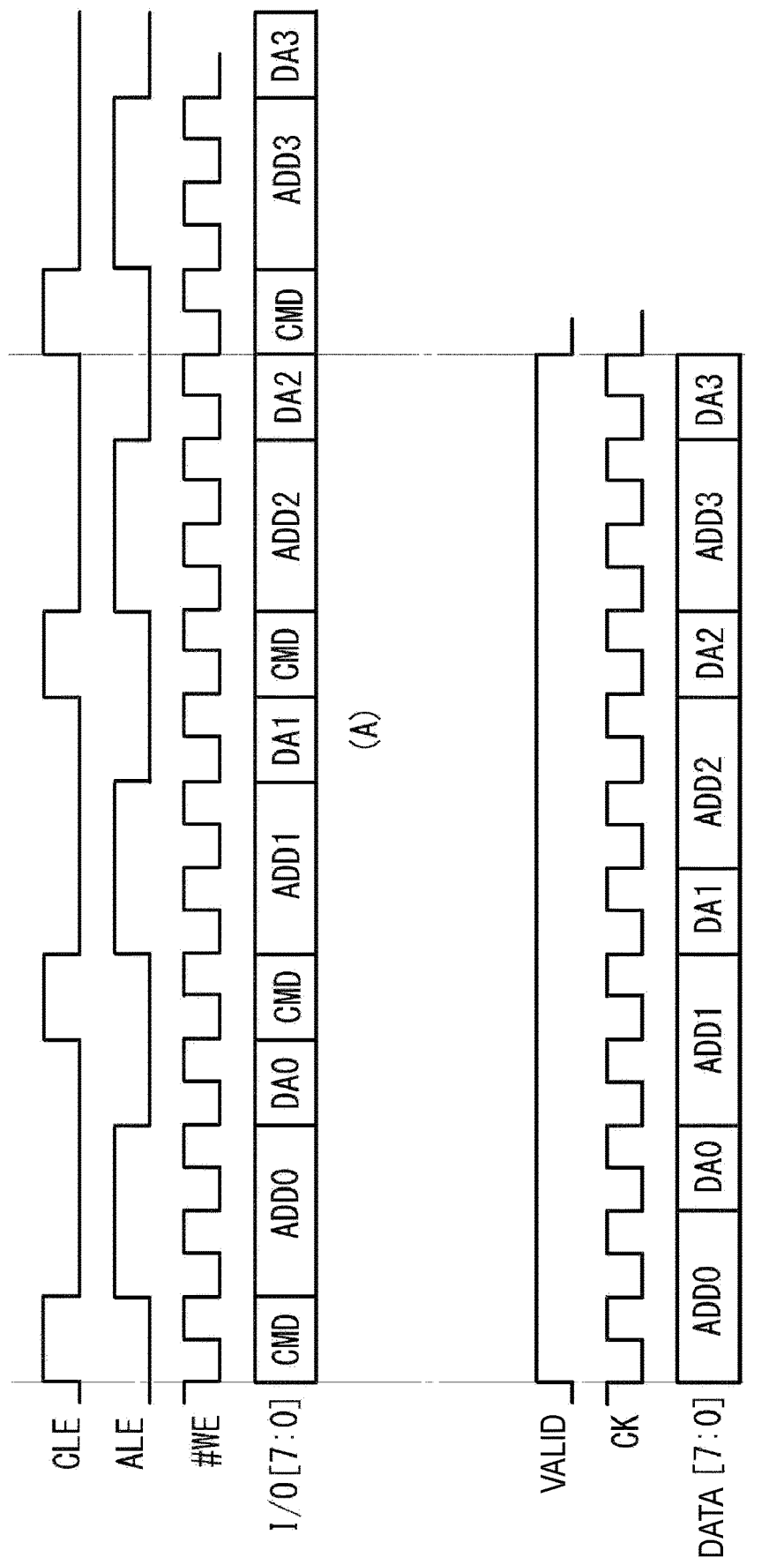

(A) of FIG. 11 and (B) of FIG. 11 are timing charts showing a copyback operation for correcting data performed by the flash memory according to the embodiment of the present disclosure.

Figure 12:
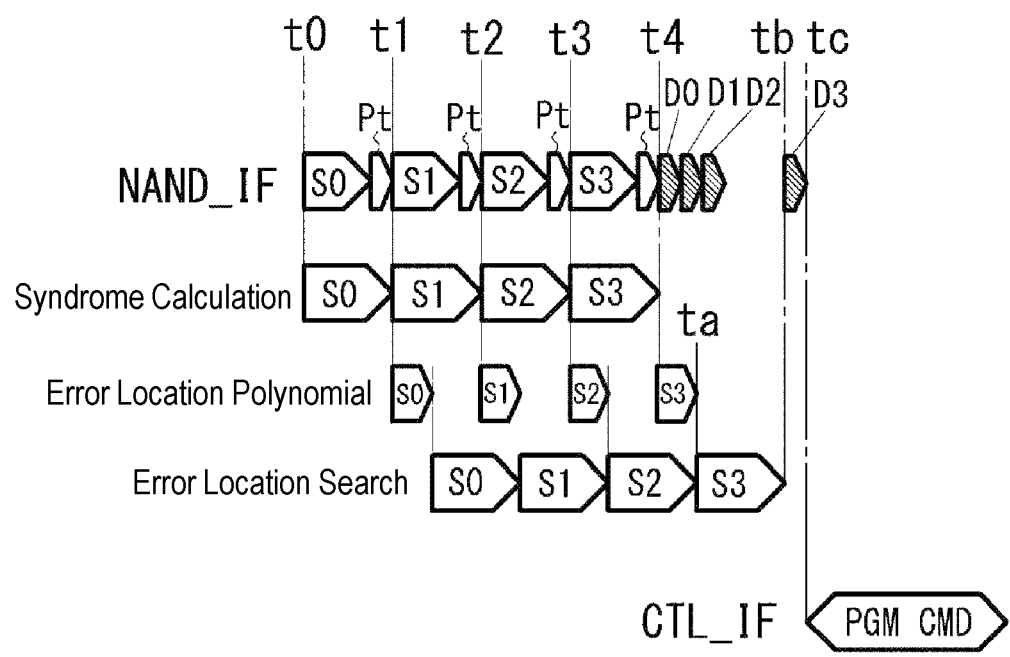

FIG. 12 is a diagram showing a timing chart of each portion of the ECC chip during the copyback operation according to the embodiment of the present disclosure.

DETAILED DESCRIPTION OF DISCLOSED EMBODIMENTS

Figure 3:
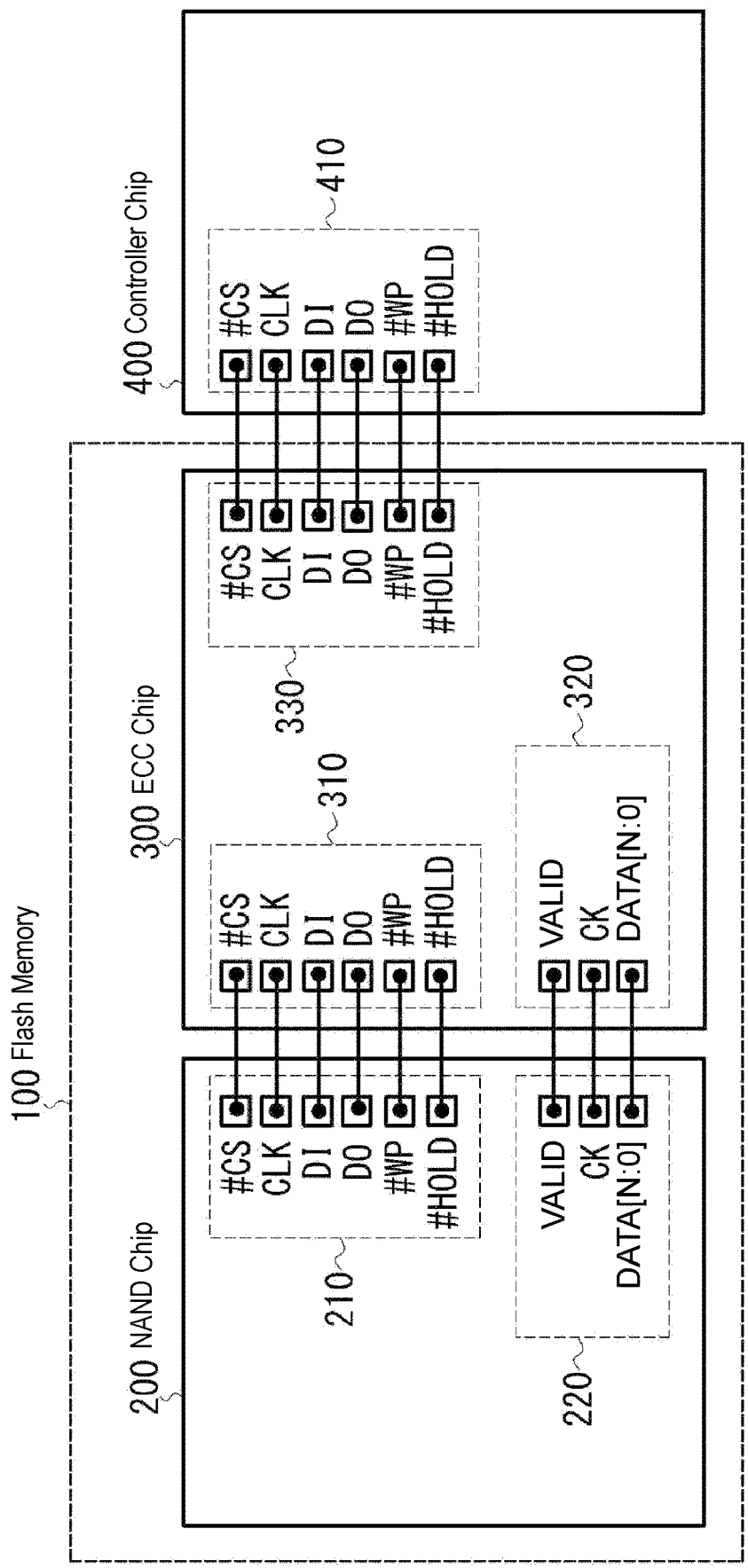
FIG. 3 is a diagram showing a schematic configuration of a flash memory according to an embodiment of the present disclosure.

FIG. 3 is a diagram showing a schematic configuration of a flash memory according to an embodiment of the present disclosure. The flash memory 100 of this embodiment includes a NAND chip 200 and an ECC chip 300 that is electrically connected to the NAND chip 200.

Although not shown here, the NAND chip 200 typically includes a NAND-type memory array and a peripheral circuit. The peripheral circuit includes a row decoder, a column decoder, a page buffer/sensing circuit, an interface circuit, a controller, an internal voltage generating circuit, etc. The controller controls read, program, and delete operations according to input commands. The memory array includes a plurality of blocks, and a plurality of NAND strings are formed in each block. The NAND strings may be formed two-dimensionally on the surface of a substrate or three-dimensionally on the surface of a substrate. A memory cell may be a single-level cell (SLC) type that stores one bit (binary data), or a type that stores multiple bits.

The NAND chip 200 includes an I/O (input and output) terminal 210 (#CS, CLK, DI, DO, #WP, #HOLD) for SPI and an I/O terminal 220 (VALID, CK, DATA) dedicated to ECC as the interface with the ECC chip 300. "#" means low active. #CS is a terminal for receiving a chip select signal used to enable or disable the chip, CLK is a terminal for receiving a serial clock signal, DI is a terminal for inputting a serial data, DO is a terminal for outputting a serial data, #WP is a terminal for receiving a signal for protecting the state register from being written, and #HOLD is a terminal for receiving a signal for holding the chip. The NAND chip 200 receives commands, addresses, and data in synchronization with the serial clock signal CLK, or outputs data in synchronization with the serial clock signal CLK through the I/O terminal 210 for SPI.

As the I/O terminal 220 dedicated to ECC, VALID is a terminal for inputting and outputting a VALID signal. The VALID signal indicates whether the data transmission between the NAND chip 200 and the ECC chip 300 is valid, and CK is a terminal of the clock signal CK used for output data transmission and ECC processing, DATA is a terminal for inputting and outputting data between the NAND chip 200 and the ECC chip 300. It should be noted here that the bit width m (data transmission width) of the DO terminal/DI terminal for SPI is, for example, ×1, ×4, or ×8, but the bit width n of the DATA terminal dedicated to ECC is configured to be relatively large than the bit width m of the DO terminal/DI terminal for SPI (n>m), for example, the bit width n is ×32. Therefore, if the frequencies of the clock signal CK and the clock signal CLK are the same, the data transmission time between the NAND chip 200 and the ECC chip 300 is n/m times faster than the data transmission time based on the SPI.

In addition, although not shown here, the NAND chip 200 may also include an ONFi interface in addition to the I/O terminal 210 for SPI. The ONFi interface includes external control terminals such as Command Latch Enable (CLE), Address Latch Enable (ALE), Write Enable (#WE), etc., and I/O terminals such as I/O etc.

The ECC chip 300 includes an I/O terminal 310 (#CS, CLK, DI, DO, #WP, #HOLD) for SPI and an I/O terminal 320 (VALID, CK, DATA) dedicated to ECC as the interface with the NAND chip 200. The I/O terminal 310 for SPI of the ECC chip 300 is respectively electrically coupled to the corresponding terminals of the I/O terminal 210 for SPI of the NAND chip 200, and the I/O terminal 320 dedicated to ECC is respectively electrically coupled to the corresponding terminals of the I/O terminal 220 dedicated to ECC of the NAND chip 200.

The ECC chip 300 further includes an I/O terminal 330 for SPI (#CS, CLK, DI, DO, #WP, #HOLD) as an interface with the controller chip 400. The I/O terminal 330 is electrically coupled to the corresponding terminal of the I/O terminal 410 for SPI of the controller chip 400. Each terminal of the I/O terminal 310 (#CS, CLK, DI, DO, #WP, #HOLD) is respectively electrically coupled to each terminal of the I/O terminal 330 (#CS, CLK, DI, DO, #WP, #HOLD) through an internal wiring. That is, although the I/O terminal 310 and the I/O terminal 330 are physically separated from each other in order to realize the connection between the NAND chip 200 and the controller chip 400, the I/O terminal 310 and the I/O terminal 330 are electrically connected to each other for the NAND chip 200 and the controller chip 400 in terms of electrical properties. Such connection is equivalent to connecting the I/O terminal 210 for SPI of the NAND chip 200 to the I/O terminal 410 for SPI of the controller chip 400.

Figure 4:
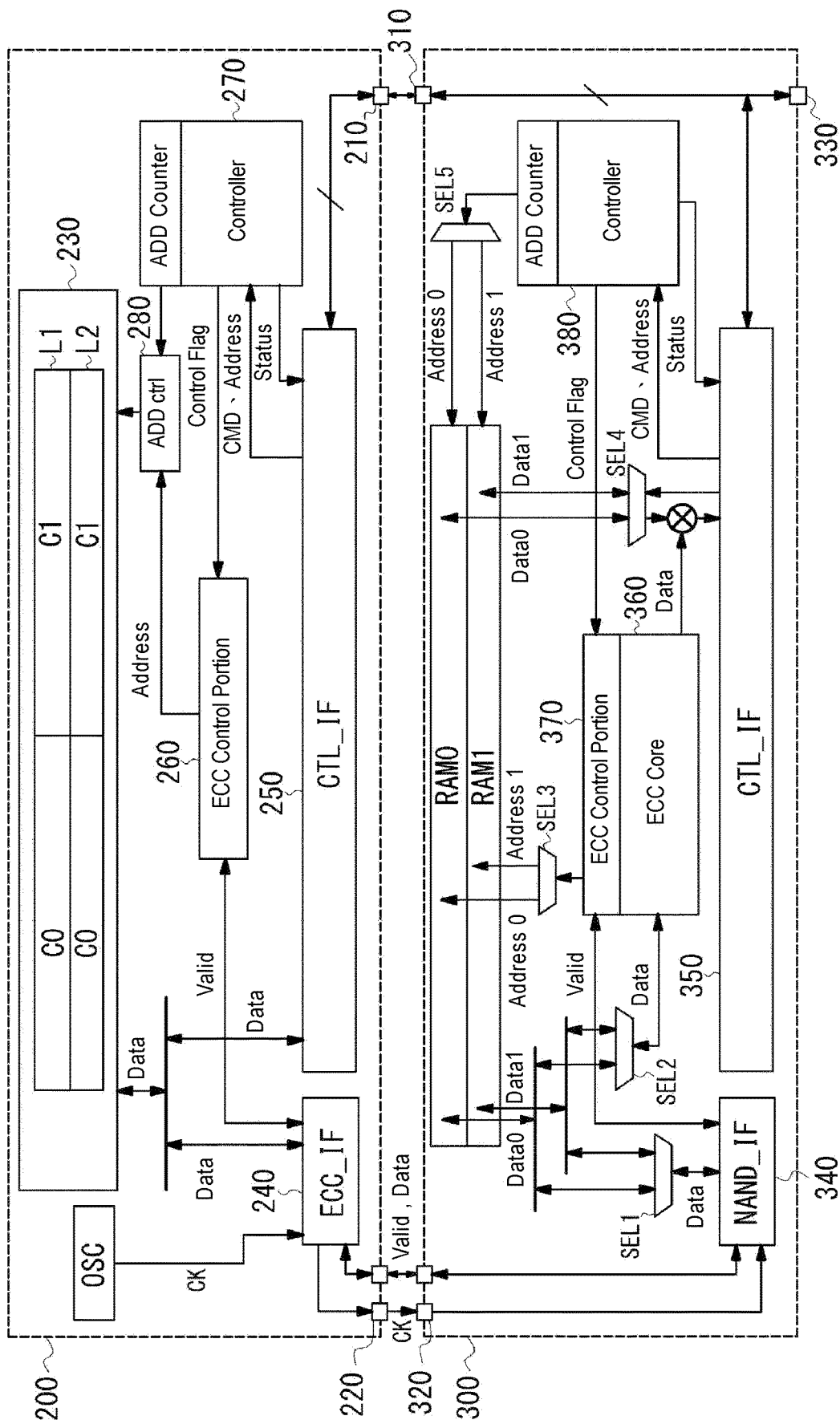
FIG. 4 is a block diagram showing the internal structure of a NAND chip and an ECC chip according to an embodiment of the present disclosure.

FIG. 4 is a block diagram showing the internal structure of a NAND chip 200 and an ECC chip 300. However, it should be noted that the structure related to the ECC operation is shown in the NAND chip 200, and not all structures are shown.

The NAND chip 200 includes: a page buffer/sensing circuit 230, including a latch L1 and a latch L2; an oscillator OSC, which generates a clock signal CK; an interface circuit (hereinafter referred to as ECC_IF) 240, which is configured to control the data transmission with the ECC chip 300 through the I/O terminal 220 dedicated to ECC; an interface circuit (hereinafter referred to as CTL_IF) 250, which is configured to control the data transmission with the controller chip 400 through the I/O terminal 210 for SPI; an ECC control portion 260; a controller 270, which receives commands and addresses input from the I/O terminal 210, includes a decoder for decoding commands or an address counter for holding and counting addresses, and controls various portions based on the decoding results of the commands; and an address control portion 280, which controls the column address of the page buffer/sensing circuit 230.

The latch L1 and the latch L2 respectively include a cache C0 and a cache C1, and the latch L1 and the latch L2 may perform bidirectional data transmission in units of the cache C0 and the cache C1. The latches L1 and L2 respectively hold a page of data (for example, 4 KB), and the cache C0 and the cache C1 hold ½ page of data (for example, 2 KB). For example, when a page contains eight sectors, the cache C0 holds the data of the four sectors of sector S0 to sector S3 (for example, a sector is 512 bytes), and the cache C1 holds the data of the four sectors of sector S4 to sector S7.

The oscillator OSC generates a clock signal CK, and the clock signal CK is a frequency that is most suitable for the data transmission time and the processing time of various portions of the ECC operation. Data transmission between the NAND chip 200 and the ECC chip 300 through the DATA terminal is performed in synchronization with the clock signal CK, and the ECC core 360 of the ECC chip 300 performs ECC processing in synchronization with the clock signal CK. The frequency of the clock signal CK is irrelevant with the frequency of the clock signal CLK of the SPI, and may be set to be higher than the frequency of the clock signal CLK.

The ECC_IF 240 receives the clock signal CK generated by the oscillator OSC, and provides the clock signal CK to the CK terminal of the ECC chip 300 through the CK terminal. During the read operation, the ECC_IF 240 outputs the read data held in the latch L2 from the DATA terminal to the DATA terminal of the ECC chip 300 at the timing synchronized with the clock signal CK, and when in programming operation, receives the parity data generated by the ECC chip 300 from the DATA terminal at the timing synchronized with the clock signal CK.

The ECC control portion 260 provides a VALID signal to the ECC_IF 240 during a read operation. The VALID signal specifies a period during which data transmission between the I/O terminal 220 dedicated to ECC and the I/O terminal 320 becomes valid. During the period specified by the VALID signal, the ECC_IF 240 transmits data from the DATA terminal of the NAND chip 200 to the DATA terminal of the ECC chip, for example, during the period when the VALID signal is high active. Moreover, the ECC_IF 240 outputs a VALID signal from the VALID terminal to the VALID terminal of the ECC chip 300, so that the NAND_IF 340 of the ECC chip 300 may receive data from the NAND chip 200.

The CTL_IF 250 controls the input and output of data through the I/O terminal 210. The CTL_IF 250 receives the command, address, and data output from the controller chip 400, provides the command and the address to the controller 270, and holds the data in the latch L2 or the latch L1.

The controller 270 decodes the input command, and controls operations such as reading, programming, and deletion based on the decoding result. Furthermore, the controller 270 provides the ECC control portion 260 with a control flag for identifying reading or programming based on the decoding result, or provides the CTL_IF 250 with a status signal indicating whether the NAND chip 200 is in a busy or standby state. The controller 270 includes an address counter that counts the column addresses input from the CTL_IF 250, and provides the address of the address counter to the address control portion 280.

The ECC control portion 260 includes logic for controlling the ECC processing, and an address counter for holding and counting addresses for the ECC processing. The ECC control portion 260 has the same configuration as the ECC control portion 370 of the ECC chip 300, that is, includes the ECC control portion 260 in synchronization with the ECC control portion 370, so that it is possible to identify which ECC operation is performed by the ECC chip 300. In addition, control flags are used for encoder or decoder switching performed by the ECC core 360.

The address control portion 280 receives the column address output from the controller 270 and the column address for ECC output from the ECC control portion 260, and provides the column address selected according to the operation of the NAND chip 200 to the page buffer/sensing circuit 230. The location of data read from the latch L2 or the location of data written to the latch L2 is controlled by the column address.

The ECC chip 300 includes: random access memories RAM0 and RAM1; an interface circuit (hereinafter referred to as NAND_IF) 340, which controls data transmission with the NAND chip 200 through an I/O terminal 320 dedicated to ECC; an interface circuit (hereinafter, referred to as CTL_IF) 350, which controls the input and output of data between the NAND chip 200 and the controller chip 400 through the I/O terminal 330 and I/O terminal 310 for SPI; an ECC core 360, which performs error detection and correction; an ECC control portion 370, which includes logic for controlling the ECC core 360 and an address counter for holding and counting addresses for ECC processing; and a controller 380, which receives commands, addresses, and data input from the I/O terminal 310 and the I/O terminal 330.

It should be noted here that the ECC chip 300 is equipped with the controller 380 so as to identify what kind of operation the NAND chip 200 is performing. The controller 380, like the controller 270 of the NAND chip 200, receives the input commands and addresses, includes the decoder for decoding the command or the address counter for holding and counting the address. Furthermore, the I/O terminal 330 for SPI is electrically coupled to the corresponding terminal of the I/O terminal 310 for SPI, and provides commands, addresses, and data from the controller 400 to both the ECC chip 300 and the NAND chip 200.

RAM0 and RAM1 respectively hold ½ page of data. For example, RAM0 holds data of sectors S0 to S3, and RAM1 holds data of sectors S4 to S7. When the read operation is performed in the NAND chip 200, during the period when the VALID signal is high active, the NAND_IF 340 sequentially receives a page of data in units of sectors from the NAND chip 200 through the I/O terminal 220 and the I/O terminal 320 dedicated to the ECC. The received data is stored in RAM0 or RAM1 selected by a selector SEL1 as Data 0 (e.g., sector S0 to sector S3) or Data 1 (e.g., sector S4 to sector S7).

When the ECC core 360 performs error detection and correction of the read data, the ECC control portion 370 selects the address of RAM0 or RAM1 through a selector SEL3, and provides the data read from the selected RAM0 or RAM1 to the ECC core 360. Under the control of the ECC control portion 370, the ECC core 360 performs syndrome calculation, Euclidean algorithm calculation, and error location search in the form of pipeline processing for the data read out from RAM0 or RAM1. In order to correct the error according to the found error location, the error bits of the data read from RAM0 or RAM1 selected by a selector SEL4 are reversed, and the corrected data is output to the controller chip 400 via the I/O terminal 330 through the CTL_IF 350.

Furthermore, when the programming operation is performed, commands, addresses, and data from the controller chip 400 are input to the ECC chip 300 in addition to the NAND chip 200. The controller 380 identifies the programming operation based on the decoding result of the command, and stores the input data in RAM0 and RAM1. The ECC control portion 370 identifies the programming operation through the control flag from the controller 380, makes the encoder of the ECC core 360 run, and provides the VALID signal to the NAND_IF 340. The VALID signal is also provided to the VALID terminal of the NAND chip 200.

Under the control of the ECC control portion 370, the ECC core 360 reads the input data held in RAM0 or RAM1, encodes the read data in unit of sectors, and generates parity data for various sectors. The generated parity data is transmitted from the DATA terminal to the DATA terminal of the NAND chip 200 via the NAND_IF 340. The NAND chip 200 holds the data received from the controller chip 400 in the latch L2, holds the parity data of various sectors received from the ECC chip 300 via the ECC_IF 240 in the latch L2 according to the column address designated by the ECC control portion 260, and transmits the data held in the latch L2 to the latch L1. Then, the controller 270 programs the data held in the latch L1 to the memory array.

Figure 5:
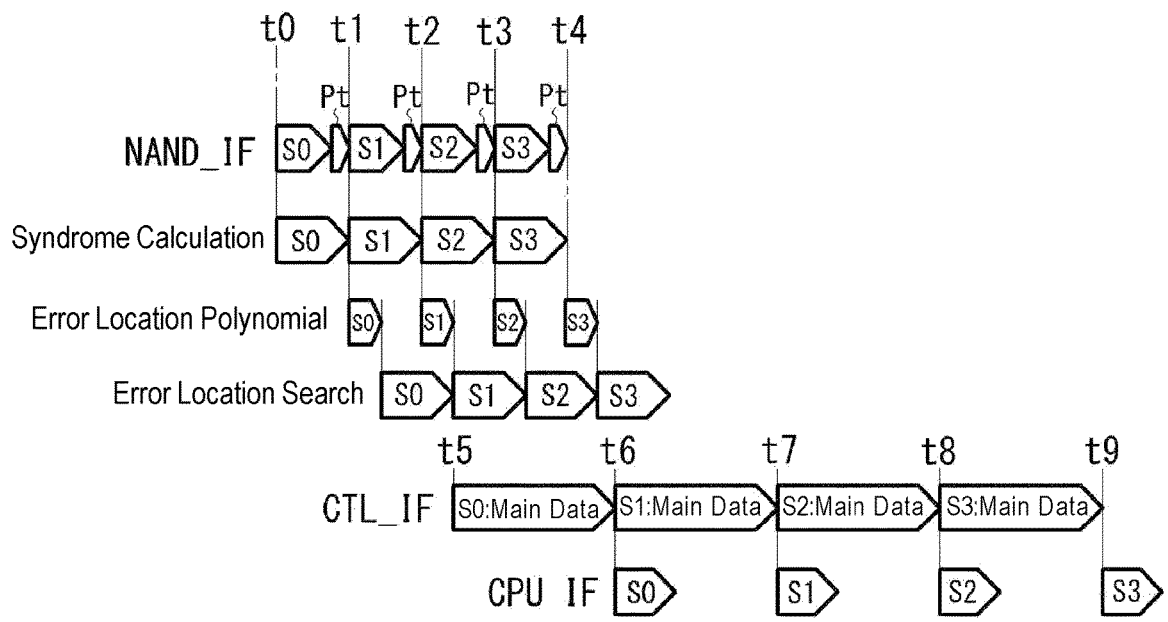
FIG. 5 is a timing chart showing the ECC operation of the flash memory according to the embodiment of the present disclosure.

Next, the details of the ECC operation of the flash memory 100 of the present embodiment will be described. FIG. 5 is a timing chart showing the decoding of the read data by the ECC core 360. When the NAND chip 200 performs the read operation according to the read command, at time t0, the ECC_IF 240 of the NAND chip 200 transmits the main data and the parity data Pt of the sector S0 held in the latch L2 from the DATA terminal in synchronization with the clock signal CK. The NAND_IF 340 of the ECC chip 300 starts to receive the main data and the parity data Pt of the sector S0 from the DATA terminal, and the reception of the main data and the parity data Pt of the sector S0 ends at time t1. Regarding the transmission time between time t0 and time t1, since the data width of the DATA terminal dedicated to ECC and the frequency of the clock signal CK have been optimized for ECC processing, the data transmission time may be shorter than the transmission time in the case of using the I/O terminal 210 for SPI. Similarly, the transmission of the main data and the parity data Pt of the sector S1 at time t2 is completed, the transmission of the main data and the parity data Pt of the sector S2 at time t3 is completed, and the transmission of the main data and the parity data Pt of the sector S3 at time t4 is completed.

The data of sectors S0 to S3 received from the NAND chip 200 are sequentially stored in RAM0. While saving the data of sector S0 to RAM0, the ECC core 360 begins to calculate the syndrome of sector S0. In an embodiment, the bit width of the DATA terminal or the frequency of the clock signal CK is set in such a way that the syndrome calculation of the sector S0 ends at time t1. After calculating the syndrome, the ECC core 360 performs ELP calculation and error location search for sector S0 during reception of sector S1.

At time t5, the ECC core 360 reads the main data of the sector S0 from the RAM0 selected by the selectors SEL4 and SEL5 in synchronization with the clock signal CLK, uses ExOR to reverse the bit error of the main data of the sector S0, and outputs the main data of the error-corrected sector S0 from the DO terminal of the I/O terminal 330 to the controller chip 400 in synchronization with the clock signal CLK for SPI. The ECC core 360 performs error correction of sector S1, sector S2, and sector S3 at time t6, time t7, and time t8, and sequentially outputs the main data of the error-corrected sector S1, the sector S2, and the sector S3 to the controller chip 400 through the I/O terminal 330. The CPU_IF of the controller chip 400 transmits the main data of the sector S0, the sector S1, the sector S2, and the sector S3 received at the time t6, the time t7, the time t8, and the time t9 to the host device. Although the ECC operations related to the sectors S4 to S7 are not shown, the processing of the sectors S4 to S7 is performed in the same manner after the processing of the sectors S0 to S3.

(A) of FIG. 6 and (B) of FIG. 6 are diagrams showing timings of data transmission of main data and parity data of sector S0. (A) of FIG. 6 shows a comparative example. The main data of sector S0 is transmitted at time t0, the parity data of sector S0 is transmitted at time t1, the main data of the next sector S1 is transmitted at time t2 after the transmission of the parity data, and the parity data of sector S1 is transmitted at time t3.

In the case where the syndrome calculation is performed concurrently with the inter-chip data transmission, it is necessary to align the timing between the data transmission and the syndrome calculation. Although the parity data is stored in the spare area, its size is 16×N bytes (N is a natural number), and not all of the spare area is used for parity data. In this embodiment, instead of transmitting the entire spare area as parity data as shown in (B) of FIG. 6, only the parity data in the spare area is transmitted. Thus, the transmission of the parity data of sector S0 may be completed before time t2. The completion of the syndrome calculation results in latency relative to the transmission of the parity data, and at the timing when the syndrome calculation of the sector S0 is completed, the transmission of data of the sector S1 starts. In order to transmit only required data at a necessary timing, both the NAND chip 200 and the ECC chip 300 are equipped with an ECC control portion 260 and an ECC control portion 370 including an address counter for ECC, and share operations related to ECC performed by the NAND chip 200 and the ECC chip 300.

Figure 1:
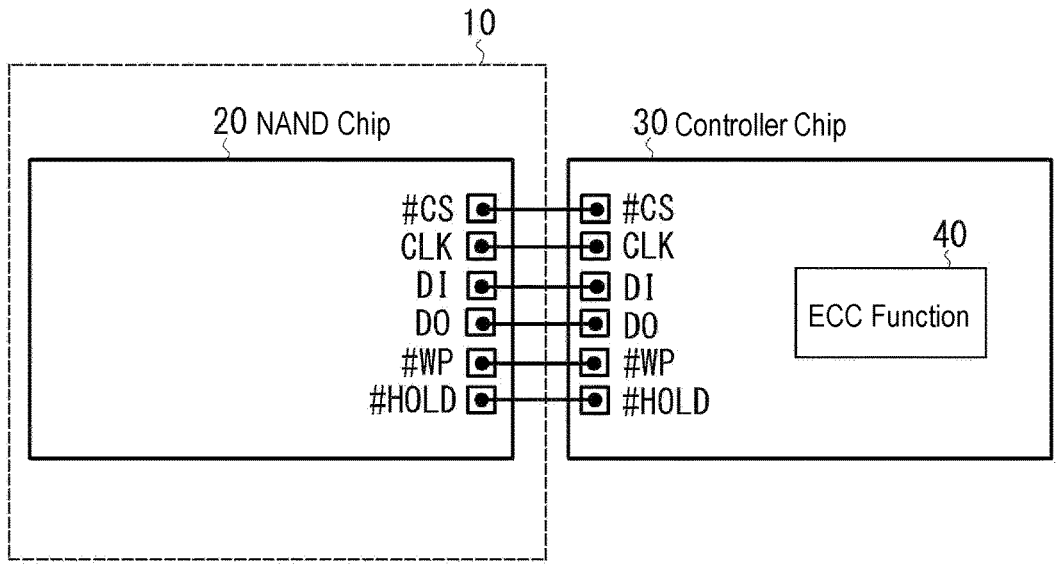
FIG. 1 is a diagram showing a schematic configuration of a conventional flash memory.
Figure 2:
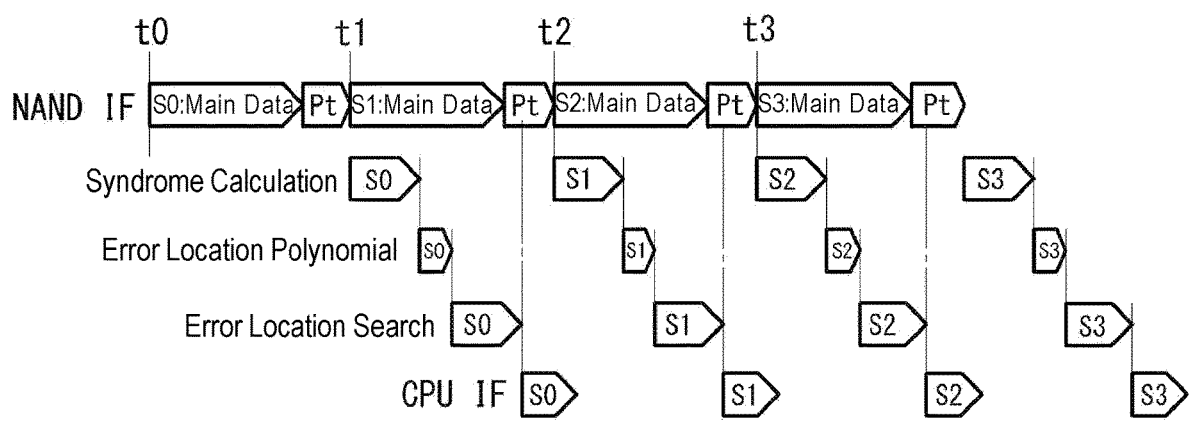
FIG. 2 is a timing chart showing the operation of the ECC function of a conventional flash memory.

(A) of FIG. 7 and (B) of FIG. 7 are diagrams showing timing charts of generating parity data by the ECC core. (A) of FIG. 7 shows the operation of the conventional example in FIG. 1. At time t0, the controller chip 30 receives the data of the sector S0 from the host device, and then receives data of the sector S1, the sector S2, and the sector S3 from the host device at regular time intervals. The controller chip 30 starts to generate parity data by the ECC function 40 at time t1, and sends the main data and the parity data Pt of the sector S0 to the NAND chip 20 through the I/O terminal for SPI at time t2. The data of the next sector S1 is received at time t3, the parity data of sector S1 starts to be generated at time t4, the generating of parity data of sector S1 ends at time t5, and the main data and parity data of the sector S1 start to be transmitted. If the NAND chip 20 receives the main data and parity data of the sector S0 to the sector S7 of a page from the controller chip 30, the data are programmed into the selected page of the memory array.

In this embodiment, as shown in (B) of FIG. 7, the controller chip 400 receives the data of the sector S0 from the host device at time t0, and then receives data of the sector S1, the sector S2 and the sector S3 from the host device at certain time intervals. At time t1, the CTL_IF of the controller chip 400 transmits the main data of the sector S0 to the ECC chip 300 through the I/O terminal 410 for SPI. Under the circumstances, the I/O terminal 210 of the NAND chip 200 is connected to the I/O terminal 410 of the controller chip 400 through the I/O terminal 310 and I/O terminal 330 of the ECC chip, so that the data of the sector S0 is imported into the NAND chip 200, and the data of the imported sector S0 is held in the latch L2.

The controller chip 400 receives the data of the sector S1 from the host device at time t2, and sends the main data of the sector S1 to the ECC chip 300 at time t3. If the ECC chip 300 completes the reception of the main data of the sector S0, the ECC core 360 generates parity data based on the main data of the sector S0, and the NAND_IF 340 sends the parity data of the sector S0 generated at time t4 from the DATA terminal dedicated to ECC to the NAND chip 200. The transmission of the parity data from the time t4 to the time t5 is performed through the I/O terminal 220 and the I/O terminal 320 dedicated to the ECC, so that the transmission is faster than the transmission carried out through the SPI. In this way, the NAND chip 200 sequentially receives the parity data of various sectors, holds the received parity data in the latch L2, transmits the data in the latch L2 to the latch L1, and the programs the main data and parity data of various sectors held in the latch L1 to the selected page of the memory array. By shortening the transmission time of the parity data between the ECC chip 300 and the NAND chip, the timing of executing programming may be accelerated.

FIG. 8 is a diagram showing the structure of the flash memory 100 of the present embodiment when the ECC chip 300 is not mounted. The flash memory 100 accommodates only the NAND chip 200 in the package, and the I/O terminal 210 for SPI of the NAND chip 200 is connected to the I/O terminal 410 for SPI of the controller chip 400. When the ECC function is not required, the cost of flash memory may be reduced by reducing the number of ECC chips.

FIG. 9 is a diagram showing a configuration of a flash memory according to a modification of the present embodiment, and the same reference numerals are assigned to the same configurations as those in FIG. 3. In this example, the flash memory 100A includes a plurality of stacked NAND chips 200A. The I/O terminal 210 for SPI and the I/O terminal 220 dedicated to ECC are electrically connected between the plurality of NAND chips 200A. For example, the I/O terminal 210 and the I/O terminal 220 between the stacked chips are commonly connected through a conductive member penetrating the silicon substrate of the stacked NAND chips. The I/O terminal 210 and the I/O terminal 220 of the uppermost NAND chip 200A in the stack are electrically connected to the I/O terminal 310 and the I/O terminal 320 of the ECC chip 300 through wiring or the like, respectively.

Although the I/O terminal 210 and the I/O terminal 220 of the NAND chip 200A are commonly connected to each other, each NAND chip 200A may determine which chip is selected. For example, the address counter of the controller 270 of each NAND chip 200A may monitor the address space of the overall memory array including all the NAND chips 200A, that is, the number of bits of the address counter may represent the address space of the overall memory array. The controller 270 determines which chip is selected by identifying the memory array corresponding to the address input by the user. In this way, by sharing one ECC chip 300 between the plurality of NAND chips 200A, it is possible to provide a flash memory which realizes high integration and shortens the processing time of the error detection and correction functions.

Next, FIG. 10 is a timing chart of a continuous read operation of the pages of the flash memory according to the present embodiment. The upper part in the diagram shows the operation of the NAND chip 200, and the lower part shows the timing of the ECC chip 300. After the NAND chip 200 outputs the data of the final address of various pages, the NAND chip 200 starts to read the next array, and starts to read out substantially continuously from the reading of the page P1 after transmitting the data of the page P0 to the latch L2.

During the period when the VALID signal is high active, the NAND chip 200 transmits the data of sector S0 to sector S7 of each page to the ECC chip 300. If the ECC chip 300 outputs data of the sector S0 to the sector S3 or the sector S4 to the sector S7 from the DO terminal in unit of cache, in response to the timing, the NAND chip 200 transmits the next page of data to the ECC chip 300. The timing of transmitting data from the NAND chip 200 to the ECC chip 300 is the timing when the ECC chip 300 outputs the final address in units of cache to the controller chip 400. For example, after the ECC chip 300 completes the output of sector S0 to sector S3 of page P0, the NAND chip 200 starts to transmit data of sector S0 to sector S3 of page P1.

Regarding the timing for the ECC chip 300 to output the final address in units of cache to the controller chip 400, it is only necessary to use the address counter in the controller 270 in the NAND chip 200 to identify the number of toggles of the clock signal CLK that is also connected to the NAND chip 200. The ADD counter in the controller 270 of the NAND chip 200 is used to control the data output from the CTL_IF 250 when the ECC chip 300 is not mounted or when the error correction is not performed. However, no data is output from the CTL_IF 250 during error correction, so the ADD counter may be used for the purpose described.

FIG. 10A is a timing chart showing a case where an interruption occurs in the continuous reading of pages. As shown in the figure, even if the data output from the DO terminal during continuous reading is interrupted due to the stop of the clock signal CLK (the location of interruption is shown at the DO terminal), since the ECC chip 300 holds the read data in RAM0 and RAM1, it is possible to prevent data from disappearing due to interruption. Also, the NAND chip 200 and the ECC chip 300 share the address of the page being read out, so that continuous reading may be resumed correctly after interruption.

Next, the copyback function of the flash memory of this embodiment will be described. In this embodiment, the I/O terminal 220 and the I/O terminal 320 dedicated to the ECC between the NAND chip 200 and the ECC chip 300 may be used to write the corrected data generated by the ECC chip back to the NAND chip 200. Under the circumstances, the number of cycles required for copyback may be further reduced than before.

In the conventional flash memory (the structure shown in FIG. 1), in order to copy back the corrected data after error correction, it is necessary to input a command to the NAND chip 20. In the event that the erroneous address is scattered, the random data registration command is used to transmit the corrected data to the NAND chip with the erroneous number. When the interface of the NAND chip 20 is ONFi, an example of the copyback operation when a 4-bit error occurs at a non-consecutive address is shown in (A) of FIG. 11.

The controller chip 30 outputs the corrected address and the corrected data to the NAND chip 20 if the error correction is completed. The random data registration command input to the I/O terminal is imported during the period when the CLE terminal is at the H level, and the corrected addresses ADD0 to ADD3 input to the I/O terminal are imported during the period when the ALE terminal is at the H level. During the period when the CLE terminal and ALE terminal are at the L level, the corrected data DA0 to corrected data DA3 of the I/O terminal are imported at the rising edge of #WE. The NAND chip 20 sets the corrected data in the latch L1 based on the corrected address, and then programs the data held in the latch L1 to the memory array according to the input programming command.

(B) of FIG. 11 shows an example of copyback operation in this embodiment. After finding the error location, the ECC core 360 reverses the error bits of the data held in RAM0 or RAM1, and holds the error-corrected data in RAM0 or RAM1. The ECC control portion 370 provides the VALID signal to the NAND_IF 340, and the NAND_IF 340 transmits the corrected data DA0 to the corrected data DA3 and the corrected address ADD0 to the corrected address ADD3 read from the RAM0 or RAM1 to the NAND chip 200 through the DATA terminal dedicated to ECC according to the VALID signal. In this embodiment, it is not necessary to input a command every time the corrected address and corrected data are transmitted, and therefore the copyback may be performed in a shorter time than in the past.

FIG. 12 is a timing chart of each portion of the ECC chip during the copyback operation of the present embodiment. The operations at times t0 to t4 are the same as those in FIG. 5. At time t4, the calculation of the ELP of the sector S3 starts, the search for the error location of the sector S3 starts at time ta, and the search for the error location of the sector S3 ends at time tb. During the period from time t4 to time tb, the NAND_IF 340 transmits the corrected data D0, D1, and D2 of the sector S0, sector S1, and sector S2 to the NAND chip 200 through the DATA terminal. If the search of error location (including error correction) of the sector S3 ends at time tb, the NAND_IF 340 transmits the corrected data D3 of the sector S3 to the NAND chip 200, and the transmission of the corrected data D3 ends at time tc. Then, a program command is input from the controller chip 400 to program the data held in the latch L1 into the memory array.

According to the present embodiment, I/O terminals dedicated to ECC are set on the NAND chip 200 and the ECC chip 300, and data related to ECC is transmitted through the dedicated I/O terminals. In this manner, although such configuration is an off-chip configuration, it allows ECC processing to be performed at high speed. In addition, in the embodiment, it is exemplified that the bit width of the DATA terminal dedicated to ECC is 32 bits (×32), but the embodiment is only an example. Moreover, the frequency of the clock signal CK need not necessarily be higher than the frequency of the clock signal CLK. If the bit width of the DATA terminal is greater than the bit width of the SPI data transmission, the frequency of the clock signal CK may also be the same as or lower than the frequency of the clock signal CLK.

The preferred embodiments of the present disclosure have been described in detail, but the present disclosure is not limited to the specific embodiments, and various modifications and changes may be made within the scope of the present disclosure described in the claims.

What is claimed is:

1. A semiconductor storage device, comprising:
a Not AND (NAND) chip, comprising an NAND-type memory array and a control member, wherein the control member controls operations associated with the memory array; and
an error checking and correcting (ECC) chip, comprising error detection and correction functions;
wherein the NAND chip comprises: a first dedicated terminal configured to perform data transmission related to error detection and correction, and the ECC chip comprises: a second dedicated terminal connected to the first dedicated terminal,
the first dedicated terminal comprises a first clock terminal and a first data terminal,
the second dedicated terminal comprises a second clock terminal connected to the first clock terminal, and a second data terminal connected to the first data terminal,
the NAND chip comprising: a generating circuit, configured to generate a clock signal shared by the first clock terminal and the second clock terminal,
data between the first data terminal and the second data terminal is transmitted in synchronization with the clock signal,
the first dedicated terminal further comprises a first valid terminal, the second dedicated terminal further comprises a second valid terminal connected to the first valid terminal,
a valid signal for validating the data transmission is provided to the first valid terminal or the second valid terminal.

2. The semiconductor storage device according to claim 1, wherein,
the NAND chip sends read data comprising parity data read from the memory array by the control member to the ECC chip through the first dedicated terminal,
the ECC chip performs error detection and correction of the read data received through the second dedicated terminal.

3. The semiconductor storage device according to claim 1, wherein,
the ECC chip sends parity data generated based on program data to the NAND chip through the second dedicated terminal,
the control member programs the program data comprising the parity data received through the first dedicated terminal to the memory array.

4. The semiconductor storage device according to claim 1, wherein,
the NAND chip generates the valid signal when sending the read data to the ECC chip, and provides the generated valid signal to the first valid terminal.

5. The semiconductor storage device according to claim 1, wherein,
the ECC chip generates the valid signal when sending the parity data to the NAND chip, and provides the generated valid signal to the second valid terminal.

6. A semiconductor storage device, comprising:
a Not AND (NAND) chip, comprising an NAND-type memory array and a control member, wherein the control member controls operations associated with the memory array; and
an error checking and correcting (ECC) chip, comprising error detection and correction functions;
wherein the NAND chip comprises: a first dedicated terminal configured to perform data transmission related to error detection and correction, and the ECC chip comprises: a second dedicated terminal connected to the first dedicated terminal, wherein, the NAND chip further comprises: a first input and output (I/O) terminal capable of sending and receiving data to/from the ECC chip, the ECC chip further comprises: a second I/O terminal capable of sending and receiving data to/from the NAND chip, wherein the first I/O terminal is connected to the second I/O terminal, a data transmission width of the first dedicated terminal and the second dedicated terminal is greater than a data transmission width of the first I/O terminal and the second I/O terminal.

7. The semiconductor storage device according to claim 6, wherein, a clock frequency of data transmission between the first dedicated terminal and the second dedicated terminal is higher than a clock frequency of data transmission between the first I/O terminal and the second I/O terminal.

8. The semiconductor storage device according to claim 6, wherein, the ECC chip further comprises: a third I/O terminal capable of sending and receiving data to/from a controller chip, the first I/O terminal is commonly connected to the second I/O terminal and the third I/O terminal.

9. The semiconductor storage device according to claim 6, wherein, the ECC chip outputs error-corrected data to a controller chip through the second I/O terminal.

10. The semiconductor storage device according to claim 6, wherein, the ECC chip outputs error-corrected data to the NAND chip through the first dedicated terminal and the second dedicated terminal.

11. The semiconductor storage device according to claim 8, wherein, the ECC chip receives the program data through the third I/O terminal, the NAND chip receives the program data from the first I/O terminal connected to the second I/O terminal and the third I/O terminal.

12. The semiconductor storage device according to claim 1, wherein, the ECC chip performs error detection and correction of read data while receiving the read data.

13. The semiconductor storage device according to claim 1, wherein the NAND chip and the ECC chip are accommodated in a package.

14. The semiconductor storage device according to claim 1, wherein the NAND chip comprises a plurality of NAND chips that are stacked, and first dedicated terminals of the respective plurality of NAND chips are commonly connected to the second dedicated terminal of the ECC chip.

* * * * *